(12) United States Patent
Tsai et al.

(10) Patent No.: US 6,423,594 B1
(45) Date of Patent: Jul. 23, 2002

(54) METHOD OF FABRICATING DEEP TRENCH CAPACITOR

(75) Inventors: Hong-Hsiang Tsai, Hsinchu; Hsi-Chuan Chen, Tainan, both of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/754,459

(22) Filed: Jan. 4, 2001

(51) Int. Cl.[7] .......................................... H01L 21/8249
(52) U.S. Cl. ...................................... 438/243; 438/386
(58) Field of Search ................................ 438/243–249, 438/386–392

(56) References Cited

U.S. PATENT DOCUMENTS 6,368,912 B1 * 4/2002 Chang et al. ............... 438/248

* cited by examiner

Primary Examiner—Hoai V. Ho
Assistant Examiner—Dung A Le
(74) Attorney, Agent, or Firm—J. C. Patents

(57) ABSTRACT

A method of fabricating a trench capacitor includes forming a trench in a substrate; forming a conductive diffusion region in the substrate surrounding a lower portion of the trench; forming a dielectric layer along an inner surface of the trench; and filling the trench with a first doped polysilicon layer. A first recess is formed to expose an upper portion of the inner sidewall of the trench. A collar dielectric layer is formed on the exposed inner sidewall. The first recess is filled with a second doped polysilicon layer. A second recess is formed to expose a part of the upper portion of the inner sidewall. A gap is formed between the exposed inner sidewall and the second doped polysilicon layer, and filled with a doped polysilicon layer converted from an undoped polysilicon layer.

10 Claims, 4 Drawing Sheets

METHOD OF FABRICATING DEEP TRENCH CAPACITOR

BACKGROUND OF THE INVENTION

1. Field of the Invention

The invention relates in general to a method of fabricating a capacitor. More particularly, this invention relates to a method of fabricating a deep trench capacitor that can be formed in a dynamic random access memory cell.

2. Description of the Related Art

As the semiconductor fabrication process has approached to a stage of deep sub-micron, a great demand in reducing the dimension of devices is evoked. However, as the software has been developed with more and more functions that require a large capacity for accessing and storing data, the capacitor in a memory has to be formed with large enough capacitance when shrinking the device dimension. Methods to increase the capacitance of a capacitor includes reducing the thickness of the dielectric layer, using a dielectric layer with a higher dielectric constant and increasing the surface area of the capacitor electrode. Currently, the former two methods still have difficulty that may seriously affect the reliability and yield of products.

Therefore, the method of increasing surface area of capacitor electrode becomes a mainstream in increasing capacitance. As mentioned above, the reduction in dimension has been greatly demanded for fabricating an advanced device, the planar area available for fabricating the capacitor is thus very restricted. To increase the surface area of capacitor electrode without occupying a large planar area, the stack capacitor and deep trench capacitor have been widely employed in manufacturing.

For the stack capacitor, structure of hemispherical grain (HSG) has also been developed for further increasing the surface area of the electrode. The stack capacitor includes crown structure, fin structure, cylinder structure and spread structure. Among all the structures, a serious problem in planarization disadvantage to size reduction for devices has occurred to affect the subsequent fabrication process such as photolithography.

In a conventional trench capacitor, establishing an electrical connection between the capacitor and the drain region of the transistor is a crucial topic. Two methods including forming conductive surface strap (SS) and conductive buried strap (BS) have been used in the prior art. The method of forming conductive surface strap can establish a shallow direct contact between the capacitor and the drain region of the transistor, however, an additional photomask is required. Therefore, currently, the method for forming conductive buried strap is preferred.

In the conventional method for forming the buried strap, the electrical connection between the capacitor and the drain region is obtained by a direct contact between a doped polysilicon layer used as a node electrode of the capacitor and the drain region. After performing thermal treatments subsequently, the dopant contained within the doped polysilicon layer will easily diffuse into the drain region to form a deep junction. The electrical performance of the device is thus degraded seriously.

In addition, when misalignment occurs the electrical performance of device may also be degraded. Therefore, the design rule has to be relaxed, otherwise the process window will be narrowed.

SUMMARY OF THE INVENTION

The invention provides a method of fabricating a trench capacitor using a shallow trench surface strap. A substrate is provided. A patterned mask layer is used to expose a portion of the substrate where a deep trench is to be formed. The exposed portion of the substrate is etched to form a deep trench. A conductive diffusion region is formed in the substrate surrounding the lower portion of the deep trench. A dielectric layer along an inner surface of the deep trench. The deep trench is filled with a first doped polysilicon layer. The first doped polysilicon layer and the dielectric layer are etched back to a first depth, so that a first recess is formed on the first doped polysilicon layer to expose the upper portion of the inner sidewall of the deep trench. A collar dielectric layer is formed on the exposed inner sidewall of the trench. The first recess is filled with a second doped polysilicon layer. The second doped polysilicon layer is etched back to a second depth, so that a second recess is formed on the second doped polysilicon layer to expose a part of the upper portion of the inner sidewall of the trench. The collar dielectric layer is etched by a wet etch process that its lower surface level is lower than the surface level of the second doped polysilicon layer, so that a gap is formed on the collar dielectric layer between the exposed inner sidewall of the deep trench and the second doped polysilicon layer. The gap is then filled with an undoped thin polysilicon layer and is CMP back to form a spacer, and etched back until the spacer top is at the same height as the silicon surface.

Using the method provided by the invention, a deep trench capacitor is formed without causing the problems in planarization. In addition, the electrical connection between the deep trench capacitor and the drain region of a transistor is established by the formation of an undoped polysilicon adjacent to the drain region. Therefore, the drawbacks of dopant diffusion caused by thermal treatment are eliminated. The thermal budget can thus be increased without causing the degradation of electrical performance. Furthermore, the process window can be widened.

Both the foregoing general description and the following detailed description are exemplary and explanatory only and are not restrictive of the invention, as claimed.

DESCRIPTION OF THE PREFERRED EMBODIMENTS

Figure 1:
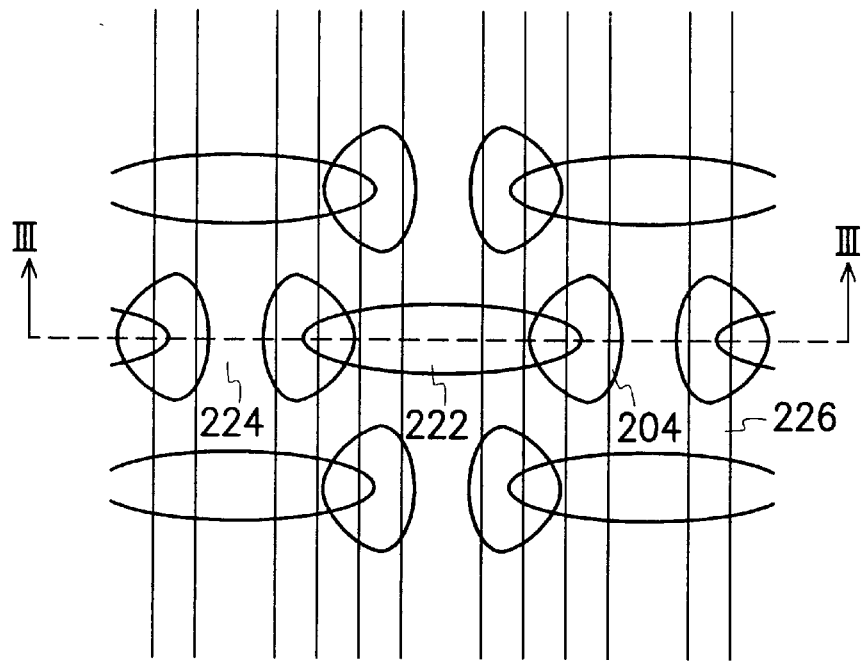
FIG. 1 shows a top view of a deep trench capacitor provided by the invention.

In this invention, a method for fabricating a deep trench capacitor in which the electrical connection to a drain region of a transistor is established by the formation of a conductive sub-surface strap (SSS). FIG. 1 is a top view showing a layout of a dynamic random access memory cell. FIG. 2A to FIG. 2G cross sectional views along the cutting line I—I, these views illustrating the structure and the fabrication process of a deep trench capacitor of a dynamic random access memory cell.

Figure 2A:
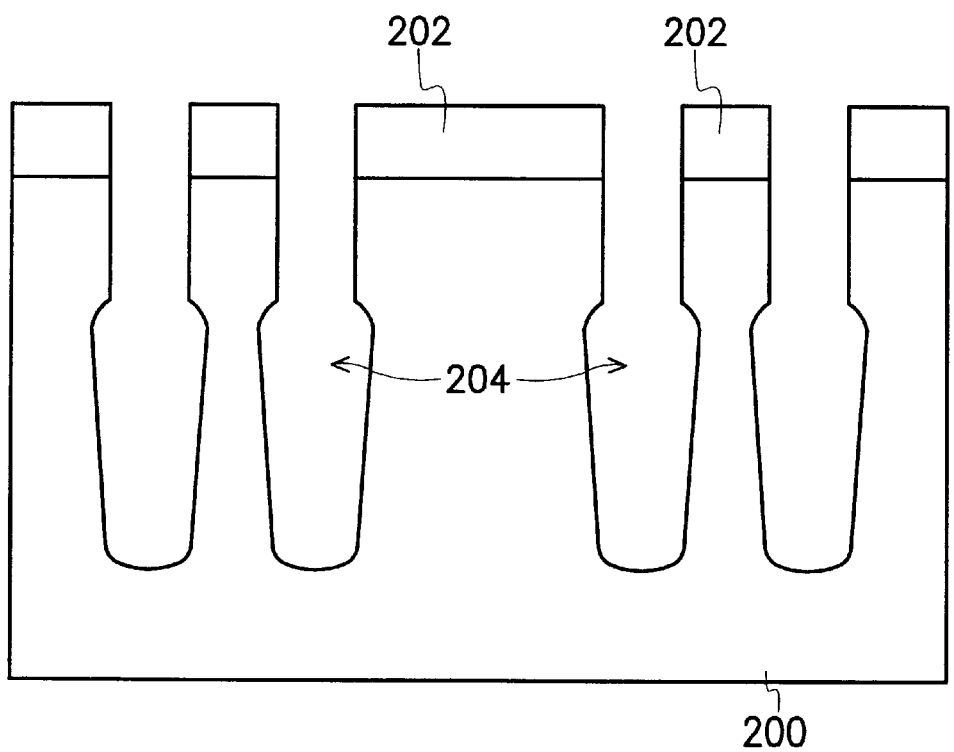
FIG. 2A to FIG. 2G are cross sectional views along the cutting lines III—III in FIG. 1.

In FIG. 2A, a substrate 200, for example, a P-type substrate, is provided. A patterned mask layer 202, for example, a silicon nitride layer formed by chemical vapor deposition (CVD) and patterned by photolithography and etching steps, is formed to partly cover the substrate 200. As shown in FIG. 2A, the regions of the substrate 200 exposed by the mask layer 202 are the positions for forming deep trenches in the subsequent processes. In this embodiment, preferably, a dry etching step and a wet etching step are performed on the exposed regions of the substrate 200 sequentially to form at least a deep trench 204.

Figure 2B:
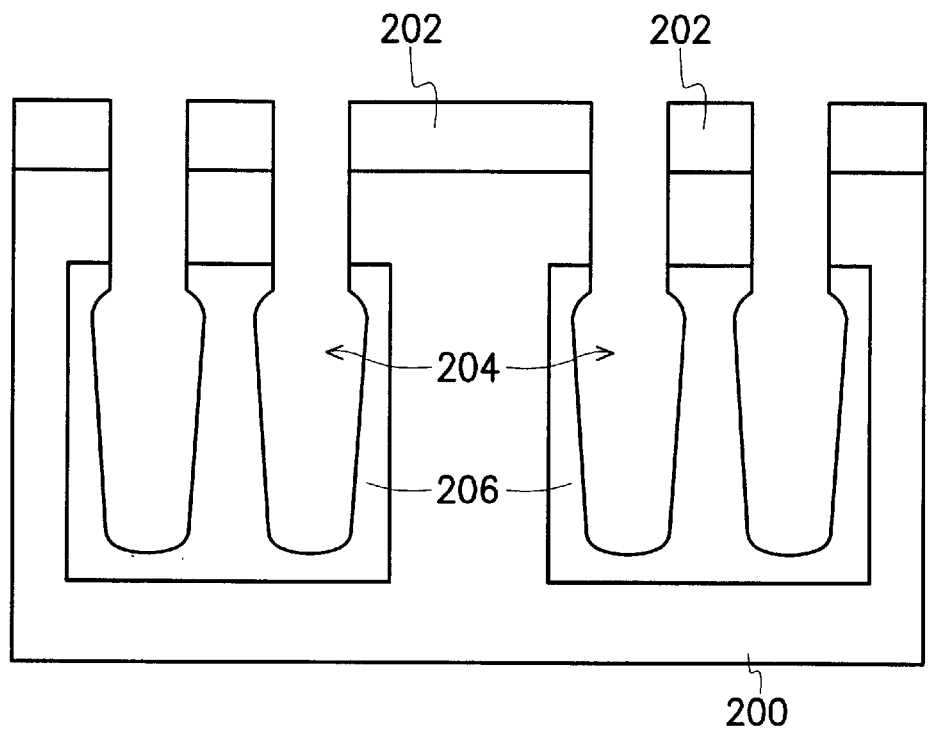

In FIG. 2B, a diffusion region 206 surrounding a lower portion of the trench is formed in the substrate 200. For example, the diffusion region 206 can be formed by way of forming a doped arsenic glass (ASG) such as a polysilicon layer (not shown) along the lower portion of trench 204, followed by a thermal treatment to diffuse the dopant contained in ASG layer towards the substrate 200. The method of forming the ASG layer includes low pressure chemical vapor deposition (LPCVD), for example. The ASG layer is then removed after the formation of the diffusion region 206. Preferably, this diffusion region 206 is used as a bottom electrode of a capacitor in a dynamic random access memory.

Figure 2C:
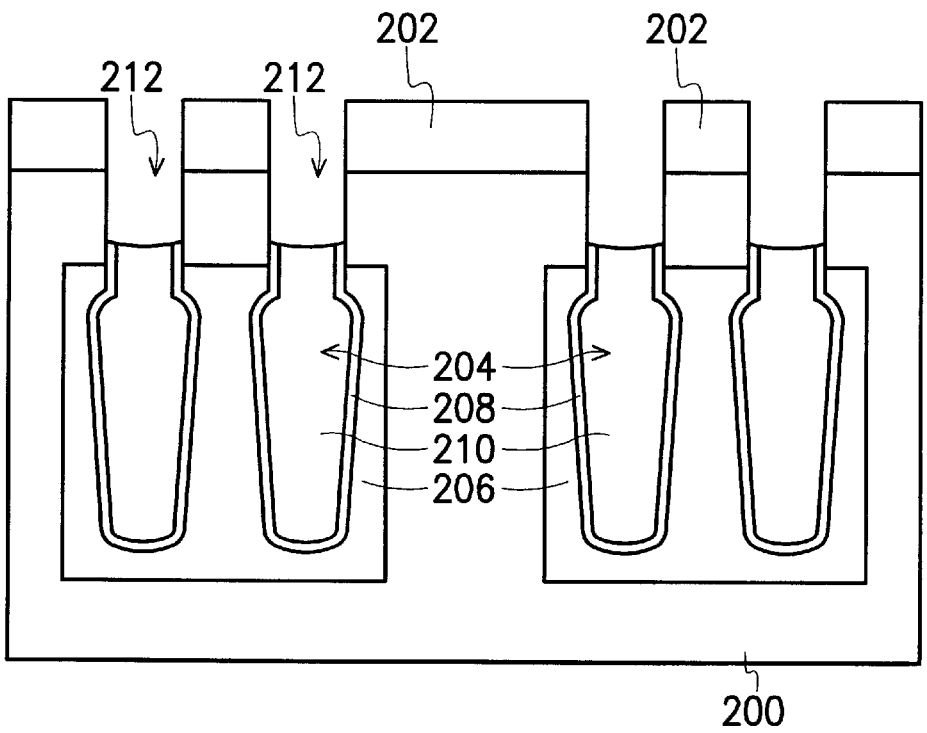

In FIG. 2C, a dielectric layer 208 is formed along an inner surface of the deep trench 204. The dielectric layer 208 comprises, for example, a silicon oxide layer and a silicon nitride layer formed by thermal oxidation and low pressure chemical vapor deposition, respectively. A doped polysilicon layer 210 is formed over the mask layer 202 to fill the trench 204 on the dielectric layer 206. The method of forming the doped polysilicon layer 210 further comprises low pressure chemical vapor deposition, for example. The doped polysilicon layer 210 and the dielectric layer 208 are then etched back to a depth of 5000 angstroms, for example, lower than a top surface of the substrate 200, so that the portion of the doped polysilicon layer 210 over the mask layer 202 is thus removed. As a consequence of the etch back process, a recess 212 that expose an upper portion of the inner sidewall of the trench 204 is formed. Preferably, as shown in FIG. 2C, the bottom of the recess 212 is higher than a top portion of the diffusion region 206. That is, the surface level of the doped polysilicon layer 204 and the dielectric layer 208 is higher than the top portion of the diffusion region 206.

Figure 2D:
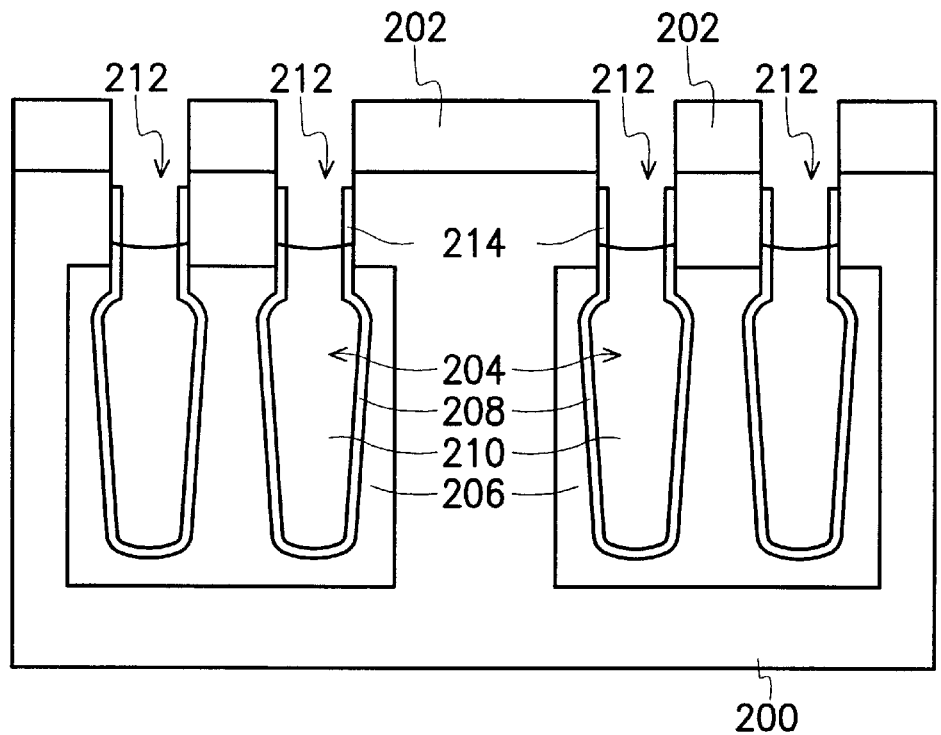

In FIG. 2D, using thermal oxidation or chemical vapor deposition, a collar dielectric layer 214, preferably a collar oxide layer, is formed along the inner sidewall exposed by the recess 212. It is appreciated that the thickness arrangement disclosed herewith is only a preferred embodiment of the invention, people skilled in the art may alter the parameters and conditions according to specific requirement within the scope that the invention claims.

The collar dielectric layer 214 is formed initially along the exposed inner sidewall of the trench 204 and over the mask layer 202. By performing a step of etch back, the portion over the mask layer 202 is removed as shown in FIG. 2D. Inevitably, over the topmost part of the inner sidewall of the trench 204, the collar dielectric layer 214 may be removed during the etch back step.

Figure 2E:
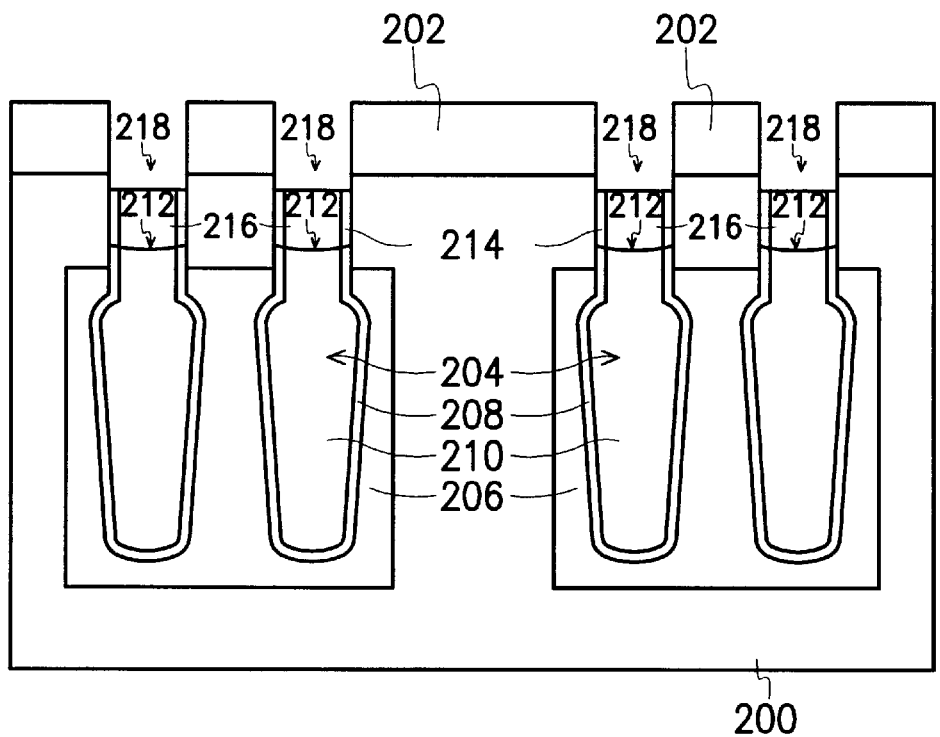

In FIG. 2E, a doped polysilicon layer 216 used as a node electrode of the capacitor is formed over the mask layer 202 and to fill the recess 212 above the trench 204. The doped polysilicon layer 216 is then etched back to result in a recess 218 thereon. Preferably, the surface level of the doped polysilicon layer 216 after being etched back is lower than a bottom edge of the drain region which is to be formed subsequently. Therefore, in any subsequent thermal process, even the dopant contained within the doped polysilicon layer 216 is to diffuse outward towards the substrate, as there is a collar oxide against the dopant to diffuse into nearby of the drain region, the formation of a deep junction around the drain region can be prevented. The collar dielectric layer 214 is further etched to a height lower than a surface level of the doped polysilicon layer 216. The collar dielectric layer is denoted by a reference numeral 214a after being etched. In this manner, a top edge of the doped polysilicon layer 216 is thus exposed, and there is a gap between the top edge of the doped polysilicon layer 216 and the inner sidewall of the trench 204. A distance between the top surface of the substrate 200 and the top surface of etched collar dielectric layer 214a is preferably a thickness around a junction depth of a conventional device (about 1000 angstroms).

Figure 2F:
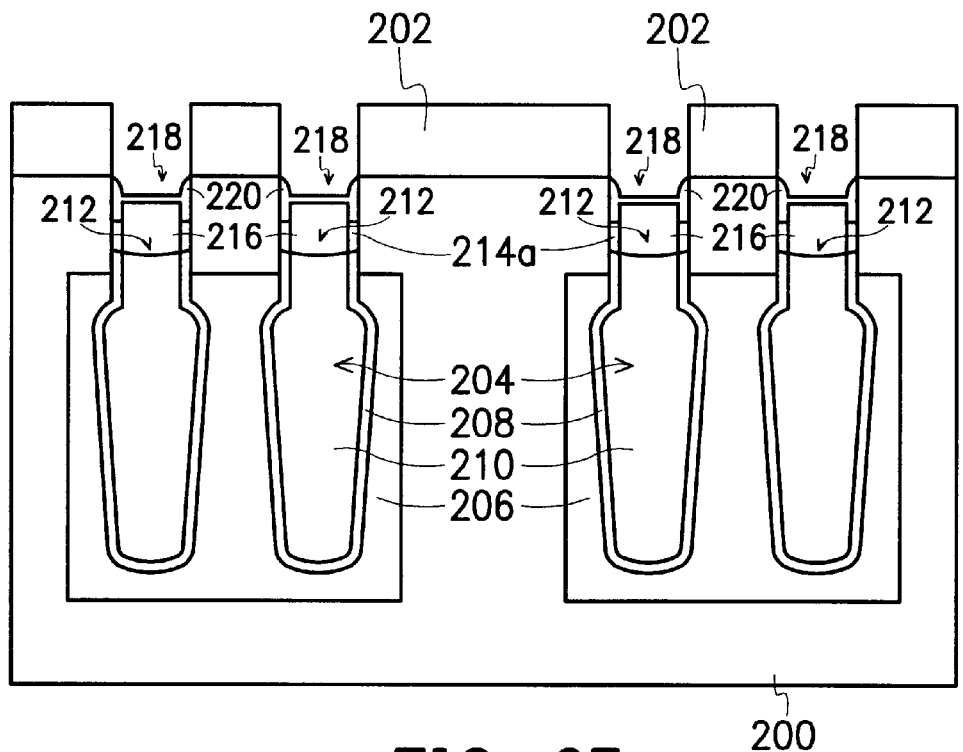

In FIG. 2F, an undoped polysilicon layer 218 is formed on and in contact with the doped polysilicon layer 216. The undoped polysilicon layer 218 also fills the gap between the doped polysilicon layer 216 and the inner sidewall of the trench 204 on the collar dielectric layer 214.

The doped polysilicon layer 220 can be formed by, for example, implanting arsenic ions and/or phosphorous ions into undoped polysilicon layer 218, or thermally anneal wafer to drive dopants from the doped polysilicon under layer 216 to dope and convert undoped polysilicon layer 218 into a doped polysilicon layer 220. Alternatively, the portion of the doped polysilicon layer 220 on the top surface of the doped polysilicon layer 216 may also be removed to the top surface to leave the portion of the doped polysilicon layer 220 filling the gap only. A distance between the top surface of the substrate 200 and the top surface of the etched doped polysilicon layer 220 is preferably around 500 angstroms.

Figure 2G:
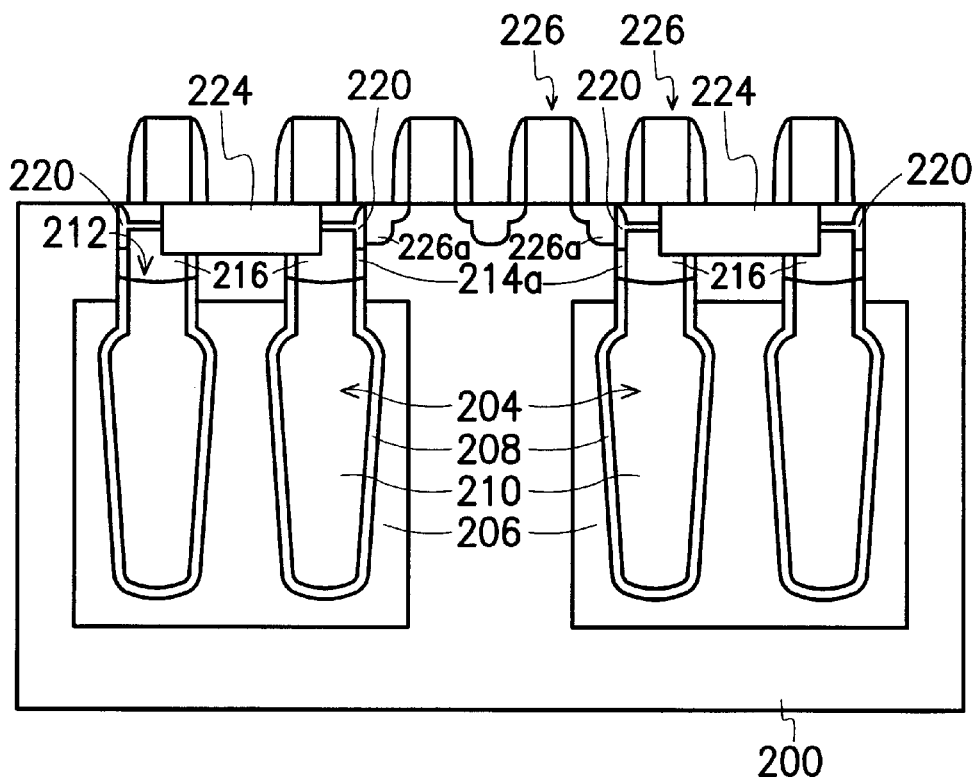

Referring to FIG. 1 and FIG. 2G, after an oxide layer filled in using CVD and planarized using CMP, the mask layer 202 is removed. Using known technique such as photolithography and etching process, an active region 222 is defined, and isolation such as shallow trench isolation is formed on the substrate 200 beyond the active region 222. In this embodiment, as shown in FIG. 2G, the shallow trench isolation 224 occupies a top portion of the trench 204. A transistor 226 is then formed on the substrate 200. The transistor 226 comprises a drain region 226a adjacent to the undoped polysilicon layer 220 on the collar dielectric layer 220. Therefore, an electrical connection between the capacitor formed in the trench 204 and the drain region 226a of the transistor 226 is established via the undoped polysilicon layer 220.

In the invention, an undoped polysilicon layer is used to electrically connect the drain region to the trench capacitor. The doped polysilicon layer as a top electrode is surrounded with the collar dielectric layer, so that the dopant contained in the doped polysilicon layer is prevented from diffusing outward to the substrate to cause a deep junction at the drain region. The invention is thus advantageous to the fabrication process for forming devices with smaller size, for example, the devices with a dimension smaller than 0.13 micron.

Without forming the deep junction at the drain region of the transistor, even when a misalignment occurs, the electrical reliability may not be affected or degraded, so that the process window is improved.

Furthermore, without forming the deep junction, a shallow trench isolation with a wider opening is allowed. Or alternatively, the deep trench (204) may be formed with an opening extending laterally toward the drain region of the transistor. A lower aspect ratio can thus be resulted to advantage the fabrication process, and the contact area of the capacitor can also be increased.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a trench capacitor, the method comprising:

providing a substrate;

forming a patterned mask layer to expose a portion of the substrate;

etching the exposed portion of the substrate to form a deep trench;

forming a conductive diffusion region in the substrate, the conductive diffusion region surrounding a lower portion of the deep trench;

forming a dielectric layer along with an inner surface of the deep trench;

filling the trench with a first doped polysilicon layer;

etching back the first doped polysilicon layer and the dielectric layer to a first depth, so that a first recess is formed on the first doped polysilicon layer to expose an upper portion of the inner sidewall of the deep trench;

forming a collar dielectric layer on the exposed inner sidewall of the deep trench;

filling the first recess with a second doped polysilicon layer;

etching back the second doped polysilicon layer to a second depth, so that a second recess is formed on the second doped polysilicon layer to expose a part of the upper portion of the inner sidewall of the trench;

etching the collar dielectric layer until a surface level thereof is lower than a surface level of the second doped polysilicon layer, so that a gap is formed on the collar dielectric layer between the exposed inner sidewall of the trench and the second doped polysilicon layer;

filling the gap with a third polysilicon layer which will become doped and conductive after dopant diffused from the second polysilicon underneath;

removing the patterned mask layer; and forming a drain region adjacent to the third polysilicon layer.

2. The method according to claim 1, wherein the third polysilicon layer is initially undoped.

3. The method according to claim 1, wherein the dielectric layer comprises an nitride layer.

4. The method according to claim 1, wherein the collar dielectric layer comprises an nitride layer.

5. The method according to claim 1, wherein the collar dielectric layer comprises a oxide layer.

6. The method according to claim 1, wherein a bottom of the first recess is higher than a top region of the conductive diffusion region.

7. The method according to claim 1, wherein the collar dielectric layer is etched to a height lower than a junction depth of a transistor comprising the drain region to be formed subsequently.

8. The method according to claim 1, wherein a distance between a top surface of the substrate and a lower top surface of the collar dielectric layer is about 1000 angstroms.

9. The method according to claim 1, wherein a distance between the top surface of the substrate and the top surface of the third doped polysilicon layer is about 500 angstroms.

10. The method according to claim 1, wherein the doped polysilicon layer is formed to cover the top surface of the second doped polysilicon layer.

* * * * *